United States Patent [19]

Osakabe et al.

[11] 4,267,603
[45] May 12, 1981

[54] MEMORY CONTROL CIRCUIT

[75] Inventors: Yoshio Osakabe; Hiroshi Yasuda, both of Yokohama, Japan

[73] Assignee: Sony Corporation, Tokyo, Japan

[21] Appl. No.: 68,421

[22] Filed: Aug. 21, 1979

[30] Foreign Application Priority Data

Aug. 22, 1978 [JP] Japan .................................. 53-102049

[51] Int. Cl.³ .......................... H04B 1/26; G11C 7/00
[52] U.S. Cl. ...................................... 455/186; 365/189
[58] Field of Search ...................... 455/179, 185, 186; 365/189; 364/200 MS File, 900 MS File

[56] References Cited

U.S. PATENT DOCUMENTS

| | | | |
|---|---|---|---|
| 3,953,801 | 4/1976 | Podowski | 455/186 |
| 4,165,489 | 8/1979 | Zato | 455/185 |

*Primary Examiner*—Marc E. Bookbinder
*Attorney, Agent, or Firm*—Lewis H. Eslinger; Alvin Sinderbrand

[57] ABSTRACT

A memory control circuit for controlling a write-in operation of an addressable memory circuit whereby a digital signal that is changeable over time is written into an addressed location in the memory circuit. An address register is provided for selecting the addressed location in the memory into which the digital signal is to be written. A control signal generator senses when a digital signal to be written into the memory circuit remains unchanged for a predetermined time interval so as to generate a control signal, this control signal being supplied to the address register for selecting the addressed location, and also being supplied to the memory circuit to initiate the write-in operation. If the digital signal does not remain constant for this predetermined interval, the write-in operation thereof is not carried out.

A preferred application of the present invention is to control a memory incorporated into an electronic radio frequency tuner, which memory is adapted to store a digital signal representing the last radio frequency which was received immediately prior to the interruption of power.

13 Claims, 4 Drawing Figures

MEMORY CONTROL CIRCUIT

BACKGROUND OF THE INVENTION

This invention relates to a memory control circuit and, more particularly, to such a control circuit which is operative to control a data write-in operation only if the data to be written into the memory subsists for a minimum time interval, thereby preventing unnecessary write-in operations from being carried out which would deteriorate the memory.

Electronic radio frequency tuners are known in which digital signals are used to establish the various tuning conditions of the tuner. In a typical electronic tuner of the so-called frequency synthesizer type, the frequency of a local oscillating signal, which determines the tuning condition of the tuner, is controlled in accordance with the particular frequency-dividing ratio which is set into a programmable frequency divider. More specifically, a variable frequency oscillator generates the local oscillating signal, and the frequency of this local oscillating signal is divided by the programmable frequency divider. Then, the frequency-divided local oscillating signal is compared in a phase comparator to a constant reference signal. Any deviation between these signals results in an error signal which is fed back to the variable frequency oscillator to vary the frequency of the local oscillating signal generated thereby. Consequently, if the frequency-dividing ratio of the programmable frequency divider is varied, the actual frequency of the local oscillating signal is correspondingly varied so as to result in a change in the tuning condition of the tuner.

In an electronic frequency synthesizer type tuner of the aforementioned type, digital signals are used to control the frequency-dividing ratio of the programmable frequency divider. If the tuner is tuned to a desired broadcast frequency, the digital signal representing that frequency, that is, the digital signal corresponding to the frequency-dividing ratio which then is set in the programmable frequency divider, may be stored in a memory circuit. The user of such a tuner may store a multiple of such frequency-representing digital signals in the memory. If the memory is an addressable memory device, the tuning condition of the frequency synthesizer may be established rapidly merely by addressing a particular storage location of the memory device so as to read out the stored digital signal therefrom, and thus establish a corresponding frequency-dividing ratio in the programmable frequency divider.

It is desirable, when the usual power switch in the electronic tuner first is turned ON, to establish a predetermined tuning condition. Typically, this tuning condition is established by reading out the digital signal stored in a particular address location of the memory circuit. Such tuning condition, preferably, is the very same tuning condition that existed at the time that power last had been interrupted from the tuner. Thus, when the power switch first is closed, the tuner is tuned to the same broadcast frequency to which it had been tuned during its last operative condition. To effect this predetermined tuning condition, the digital signal representing the broadcast frequency which had been received immediately prior to turning the power switch OFF should be stored in a predetermined address location of the memory circuit so that, when the power switch next is turned ON, this location can be addressed and the digital signal stored therein can be read out and used to determine the dividing ratio of the programmable frequency divider. In one attempt to store this digital signal, it has been proposed to write in the digital signal, representing the frequency which then is being received, into a predetermined address location only in response to turning the power switch OFF. This generally requires a capacitor to be charged while the power switch is ON, and then to be discharged to a write-in circuit when the power switch is turned OFF. To ensure a sufficient write-in time duration, the capacitance of the capacitor must be sufficiently large. Desirably, the memory circuit which is used to store this, as well as the other frequency-representing digital signals, should be a non-volatile memory such that the contents thereof are stored even when power is removed therefrom. An example of such a non-volatile memory is an MNOS memory. Alternatively, if a voltage memory is used, a back-up battery must be provided in order to supply power to that memory such that it can retain the digital signals stored therein even when the main power switch of the tuner is turned OFF. However, typical non-volatile memories require a relatively long write-in time duration. Consequently, the capacitor which is used to control the write-in operation when the power switch is turned OFF must be of extremely high capacitance.

Another proposal for storing the digital signal representing the last-received broadcast frequency to which the tuner is tuned immediately prior to power interruption provides a sensing circuit for sensing whenever the frequency-representing digital signal is changed to initiate a write-in operation such that this new digital signal is stored in a predetermined address of the memory. Since it is not known when the user of the tuner will turn the power switch OFF, the content of this predetermined addressed location in the memory must be updated with each new digital signal. This, however, means that if the user merely is scanning the various broadcast frequencies, the frequency-representing digital signal will change relatively rapidly. Since each new digital signal must be stored in the predetermined memory address location, a large number of write-in operations must be carried out. Since a non-volatile memory will deteriorate if it is subjected to many write-in operations, it is appreciated that this proposal is disadvantageous because it requires the writing in of many digital signals, in succession, even though such digital signals may represent merely transient broadcast frequencies in which the user may not be interested.

OBJECTS OF THE INVENTION

Therefore, it is an object of the present invention to provide an improved memory control circuit which overcomes the aforenoted disadvantages of proposed control circuits described hereinabove.

Another object of this invention is to provide an improved memory control circuit which is readily adapted for use with a non-volatile memory.

A further object of this invention is to provide a memory control circuit wherein the number of memory write-in operations is minimized, and unnecessary write-in operations are avoided.

An additional object of this invention is to provide an improved memory control circuit for use in an electronic tuner in which a digital signal representing the tuning condition of that tuner which existed immediately prior to the interruption of power thereto is written into a predetermined address of a memory circuit, whereby the last-attained tuning condition is stored for future use.

Yet another object of this invention is to provide an improved memory control circuit wherein a digital signal that is changeable with time is written into a memory circuit provided that digital signal was substantially constant for a predetermined time duration.

Various other objects, advantages and features of the present invention will become readily apparent from the ensuing detailed description, and the novel features will be particularly pointed out in the appended claims.

SUMMARY OF THE INVENTION

In accordance with the present invention, a memory control circuit is provided for controlling a write-in operation of an addressable memory circuit, whereby a digital signal that is changeable over time is written into an address location in that memory circuit. An address register is provided for selecting the address location in the memory into which the digital signal is to be written. A control signal generator senses when the digital signal remains unchanged for a predetermined time interval so as to generate a control signal, this control signal being supplied to the address register for selecting the addressed location, and also being supplied to the memory circuit to initiate the write-in operation.

The memory control circuit of this invention is particularly applicable for use with an addressable memory circuit in an electronic radio frequency tuner, wherein the digital signal that is written into the memory circuit represents a particular radio frequency to which the tuner is tunable. In a particular use of this invention, the digital signal which represents the radio frequency to which the tuner had been tuned immediately prior to the interruption of power thereto is stored in a predetermined address location of the memory circuit.

BRIEF DESCRIPTION OF THE DRAWINGS

The following detailed description, given by way of example, will be best understood in conjunction with the accompanying drawings in which.

DETAILED DESCRIPTION OF A PREFERRED EMBODIMENT

Figure 1:
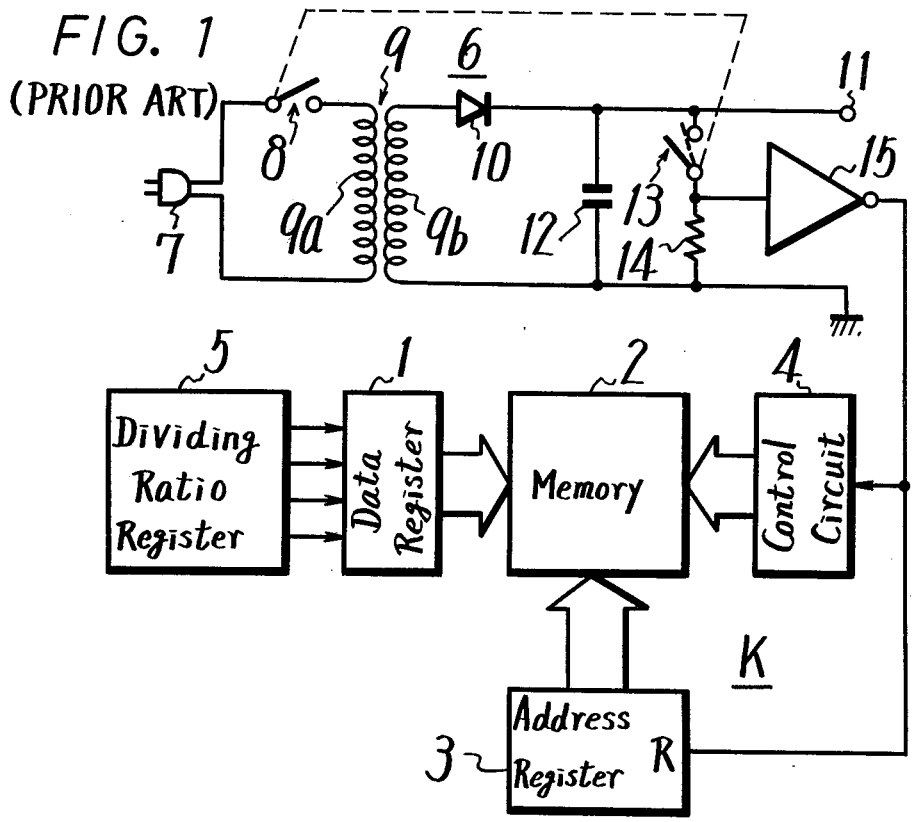
FIG. 1 is a block diagram of a typical prior art proposal of a memory control circuit.

Before describing the present invention, reference is made to a prior art proposal for a memory control circuit, shown in FIG. 1. In the various drawing figures discussed herein, the same reference numerals are used throughout to identify like component parts. In the FIG. 1 proposal, a memory circuit K is controlled such that a digital signal supplied thereto by a data register 1 is written into an addressed location of the memory circuit. Memory circuit K is comprised of an addressable memory device 2, and a write-in control circuit 4. An address register 3 is connected to memory device 2 and serves to generate an address to select a corresponding location of the memory device into which the digital signal which is supplied by data register 1 is written. As an example thereof, memory device 2 may comprise a non-volatile memory, such as an MNOS memory. As is known to those of ordinary skill in the art, a relatively long write-in time duration is needed in order to write a digital signal into an addressed location of an MNOS memory. Of course, the advantage of such a non-volatile memory is that the contents thereof can be stored even when power is removed therefrom, without the requirement of a so-called back-up battery.

Memory circuit K, together with address register 3 and data register 1, is readily adapted to be used in an electronic tuner, such as the aforementioned frequency synthesizer tuner. It is recalled that the tuning condition of the frequency synthesizer tuner is established by the frequency-representing digital signal which is used to establish the frequency-dividing ratio of the programmable frequency divider normally provided in such a frequency synthesizer tuner. The digital signal which is used to set the dividing ratio of the programmable frequency divider is provided by a dividing ratio register 5 which, in addition, supplies this digital signal to data register 1 for storage in memory device 2. This digital signal may be produced by, for example, an UP/DOWN counter whose count is incremented or decremented in order to change the tuning condition of the tuner and thereby scan the radio broadcast frequency spectrum. Alternatively, frequency-representing digital signals which may be stored in accessible sections of memory 2 (not shown) may be read out therefrom in response to, for example, a push button selector switch, so as to establish a desired tuning condition. Such a read out digital signal may be supplied to dividing ratio register 5, from which it is used to set the frequency-dividing ratio of the programmable frequency divider, and from which it also is supplied to data register 1.

Address register 3 has an input terminal, such as a reset input R, connected in common with an input of a write-in control circuit 4 to receive a control signal that is produced when the power supplied to the tuner is interrupted. The circuit for producing this control signal is identified by reference 6 and is comprised of a power switch 8, a transformer 9, a capacitor 12, a switch 13 and an inverter 15. Transformer 9 includes a primary winding 9a connected to a power supply plug 7 via power switch 8. Power supply plug 7 is, of course, adapted to be connected to AC mains so as to supply power to the power supply circuit (not shown) of the tuner. Power switch 8 is adapted to be closed to its ON condition such that current flows through primary winding 9a, and to be opened to its OFF condition, whereby power is interrupted from the primary winding.

Secondary winding 9b is connected to an output terminal 11 via a peak detector circuit formed of positively poled diode 10 and capacitor 12. It is appreciated that, when power switch 8 is turned ON, positive half-cycles of the current supplied from the AC mains are used to charge capacitor 12. This charged DC voltage across capacitor 12 is supplied to output terminal 11 from which suitable energizing potentials are derived and supplied to the circuits of the tuner. A resistor 14 is selectively connected in parallel across capacitor 12 by switch 13 which is ganged for concurrent operation with power switch 8. More particularly, when power switch 8 is closed to its ON condition, switch 13 is opened to its OFF condition. Conversely, when power switch 8 is opened to its OFF condition, switch 13 is closed to its ON condition. Thus, it is seen when power normally is supplied to the tuner, switch 13 is opened and resistor 14 is not connected across capacitor 12. However, when power is interrupted from the tuner, switch 13 is closed to connect resistor 14 across capacitor 12, thereby providing a discharge path for the voltage which is charged across the capacitor. Switch 13 additionally connects inverter 15 to capacitor 12 to invert the level of the charged capacitor voltage.

It is expected that, during normal operation of the tuner, digital signals which change with time are provided by dividing ratio register 5. These digital signals are supplied via data register 1 to memory device 2. However, during such normal operation of the tuner, power switch 8 is ON and switch 13 is OFF. Consequently, a relatively low potential, such as ground, is supplied to the input of inverter 15, the latter serving to invert this signal to a relatively higher potential which is supplied in common to the reset input R of address register 3 and to the input of write-in control circuit 4. This relatively high potential is not effective to reset the address register, and it is not effective to actuate the write-in control circuit. Consequently, the digital signals which are supplied to memory device 2 by data register 1 from dividing ratio register 5 during normal operation of the tuner are not written into the memory device by the illustrated memory control circuit. However, when power is interrupted from the tuner, that is, when the power switch is turned OFF, switch 13 is turned ON to supply the charged voltage across capacitor 12 to inverter 15. This relatively higher potential is inverted by the inverter and supplied to the reset input R of address register 3 and to the input terminal of write-in control circuit 4. This relatively lower potential resets the address register to supply a predetermined address, such as [000] to memory device 2. Furthermore, this relatively low potential actuates the write-in control circuit to enable memory device to store the digital signal then supplied thereto by data register 1 in address location [000] selected by address register 3. Thus, it is seen that the digital signal which had been provided by dividing ratio register 5 immediately prior to the interruption of power to the tuner is stored in the predetermined address location [000] selected by address register 3 in memory device 2. This digital signal represents the broadcast frequency to which the tuner had last been tuned at the time that power thereto was interrupted. If memory device 2 is an MNOS memory, a relatively long write-in duration is needed to insure that the digital signal supplied thereto is stored. This means that the capacitance of capacitor 12 should be relatively large. As an example, the write-in time duration required for proper operation of memory device 2 may be on the order of 10 milliseconds.

Figure 2:
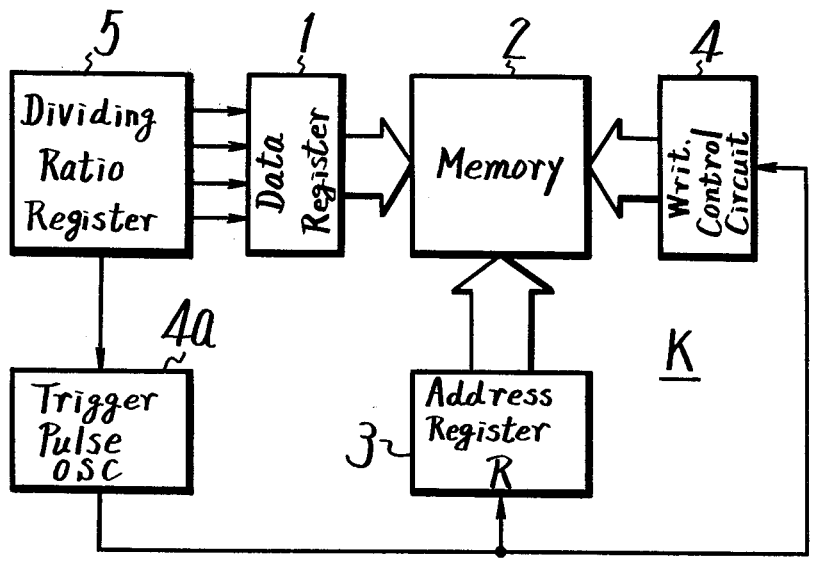
FIG. 2 is a block diagram of another prior art proposal for a memory control circuit.

Another proposal for a memory control circuit is shown in FIG. 2. This proposal is seen to be quite similar to that described with respect to FIG. 1, except that the proposal in FIG. 2 omits circuit 6. Nevertheless, the FIG. 2 proposal serves to control memory device 2 such that the digital signal representing the broadcast frequency to which the tuner had been tuned immediately prior to the interruption of power thereto is supplied in the memory device when power is interrupted. This is achieved by providing a trigger pulse oscillator, or generator 4a connected to dividing ratio register 5, the trigger pulse generator being responsive to a change in the digital signal provided by the dividing ratio register to generate a trigger pulse. This trigger pulse is supplied to the reset input R of address register 3 and to the input terminal of write-in control circuit 4 as a control signal therefor. As an example, if the contents of dividing ratio register 5 are changed in synchronism with a timing pulse, this timing pulse also may be supplied to the trigger pulse generator for actuating same to generate the trigger pulse. Alternatively, other sensing circuitry may be provided to sense when the contents of the dividing ratio register have been changed so as to trigger the trigger pulse generator.

In the proposal of FIG. 2, it is appreciated that a trigger pulse is generated by trigger pulse generator 4a in response to each change in the digital signal provided by dividing ratio register 5. Thus, even when the digital signal is changed by the user such that the tuning condition steps from one broadcast frequency to another and remains at each stepped broadcast frequency for only a limited period of time, the trigger pulse is generated. As a consequence thereof, each changed digital signal is written into address location [000] selected by address register 3 in response to the trigger pulse supplied thereto. That is, the content of this particular address location in the memory device is updated with each change in the digital signal, regardless of the length of time that the changed digital signal subsists. Of course, since the proposal shown in FIG. 2 is not responsive directly to an interruption in power to the tuner, it is seen that, since each digital signal is stored in address location [000] of memory device 2, the last-produced digital signal immediately prior to a power interruption will be stored. Thus, the control circuit of FIG. 2 achieves the same objective as the control circuit of FIG. 1. That is, the digital signal representing the broadcast frequency to which the tuner had been tuned immediately prior to an interruption in power thereto is stored in memory device 2 such that this same tuning condition can be established when power subsequently is resumed. However, the proposal of FIG. 2 requires that the write-in operation be performed many times. That is, even those digital signals which are provided by dividing ratio register 5 for only brief durations are written into the predetermined address location [000] of memory device 2. Such numerous write-in operations result in deterioration of a non-volatile MNOS memory.

Figure 3:
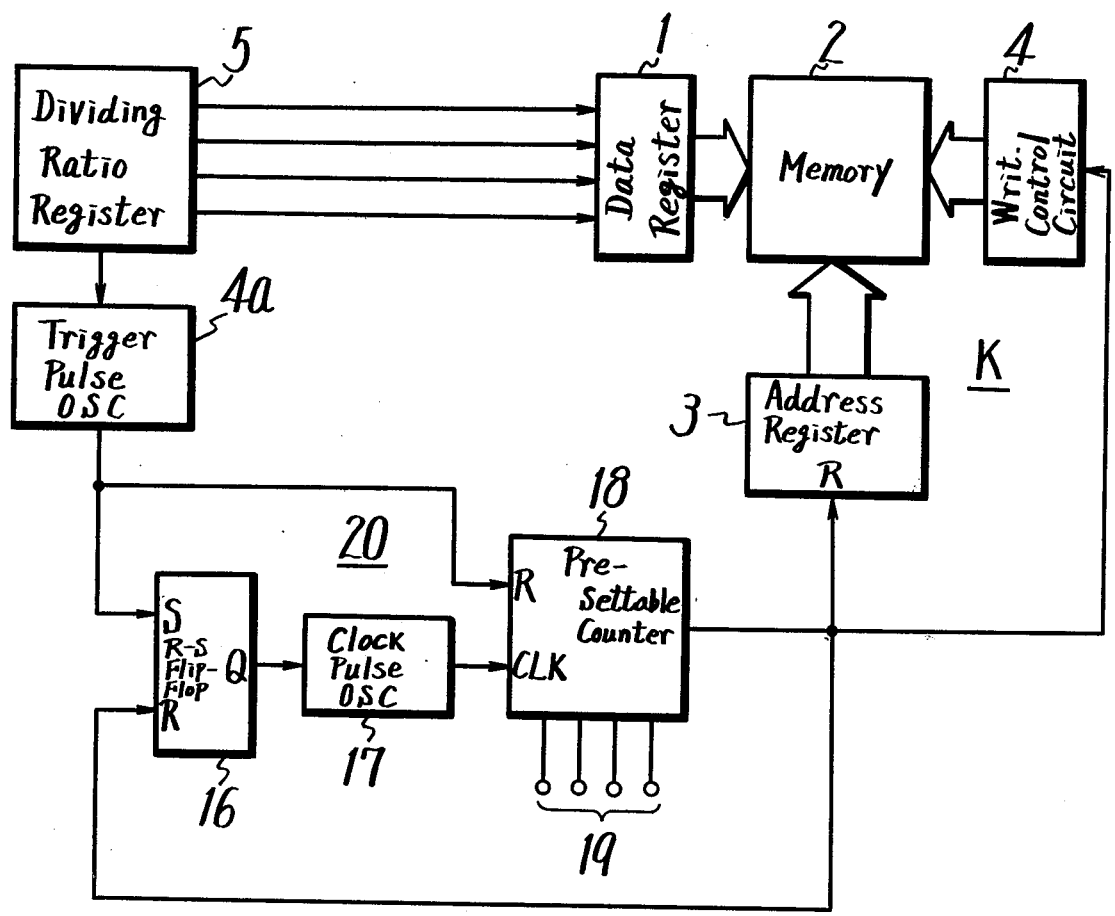
FIG. 3 is a block diagram of one embodiment of the present invention.

The present invention, one embodiment of which is shown in FIG. 3, overcomes the aforenoted disadvantages of the proposals shown in FIGS. 1 and 2. The embodiment of FIG. 3 includes many of the components shown and described with respect to FIG. 2 and, additionally includes a sensing circuit 20 which is adapted to sense when a new digital signal provided by dividing ratio register 5 remains substantially constant for at least a predetermined time duration. Sensing circuit 20 includes a flip-flop circuit 16, such as an R-S flip-flop circuit, a clock pulse oscillator 17 and a presettable counter 18. The output of sensing circuit 20 is produced by the presettable counter, and is supplied as the control signal to the reset input R of address register 3 and to the actuating input terminal of write-in control circuit 4.

Flip-flop circuit 16 includes a set input S connected to trigger pulse generator 4a to receive the trigger pulse produced by the trigger pulse generator. The Q output of this flip-flop circuit is supplied as an enabling signal to clock pulse oscillator 17. The clock pulse oscillator may include an enable input connected to the Q output of flip-flop circuit 16 to receive this enable signal so as to supply clock pulses to the clock input CLK of presettable counter 18. Alternatively, clock pulse oscillator 17 may include an oscillator circuit, such as an astable multivibrator, and an AND gate having one input connected to receive the clock pulses generated by the oscillator and another input connected to receive the enable signal provided by the Q output of flip-flop circuit 16. Such an AND gate may serve to gate clock pulses to the CLK input of the presettable counter. Presettable counter 18 additionally includes a reset input R connected to the output of trigger pulse generator 4a to receive the trigger pulse so as to be reset to a predetermined count. This predetermined count is determined by various potentials constituting binary "1" and "0" preset signals supplied to preset input terminal 19 thereof. That is, depending upon a preset count signal which is supplied to these preset input terminals 19, presettable counter 18 is set (or reset) to the predetermined, preset count established by this preset count signal in response to the trigger pulse which is supplied to reset input R thereof. The output of presettable counter 18, that is, the control signal produced by sensing circuit 20, is fed back to the reset input R of flip-flop circuit 16.

In operation, trigger pulse generator 4a is triggered to generate a trigger pulse in response to each change in the digital signal provided by dividing ratio register 5. That is, each time that a new digital signal is provided so as to establish a new tuning condition of the tuner, a trigger pulse is produced. This trigger pulse is supplied to the set input S of flip-flop circuit 16 to set this flip-flop circuit to its first state and, additionally, the trigger pulse is supplied to the reset input R of presettable counter 18 to set the count of this presettable counter to a preset count determined by the preset count signal supplied to preset input terminals 19 thereof. The first state of flip-flop circuit 16 enables the clock pulses generated by clock pulse oscillator 17 to be supplied to the CLK input of the presettable counter. These clock pulses are counted and, when the presettable counter has attained a predetermined count, an output control signal is produced thereby and supplied to the reset input R of address register 3 and to the actuating input terminal of write-in control circuit 4. This control signal additionally is fed back to the reset input R of flip-flop circuit 16 to reset the flip-flop circuit to its second state, thereby inhibiting further clock pulses from being supplied to the CLK input of the presettable counter. It is appreciated that when the reset input R of address register 3 is supplied with the control signal, the address [000] is generated, and this corresponding address location in memory device 2 is selected. Also, write-in control circuit 4 is actuated by the control signal so as to initiate a write-in operation, whereby the digital signal provided by dividing ratio register 5 and supplied to data register 1 is written into address location [000].

If the digital signal provided by dividing ratio register 5 changes prior to the time that presettable counter 18 attains its predetermined count, it is appreciated that another trigger pulse is generated by trigger pulse generator 4a in response to this change in the digital signal. This subsequent trigger pulse resets presettable counter 18 to its preset count, and the counting cycle of the presettable counter is repeated. Thus, it is seen that, unless a new digital signal provided by dividing ratio register 5 subsists for a predetermined time duration, that is, for a time which is sufficient to enable presettable counter 18 to reach its predetermined count, a write-in operation is not carried out. If, however, the digital signal remains substantially constant for the predetermined time duration required for presettable counter 18 to attain its predetermined count, this digital signal is written into address location [000] of memory device 2, and sensing circuit 20 is reset to a condition to respond to the next trigger pulse which will be generated when a new digital signal is provided.

Hence, the [000] address location of memory device 2 is updated with a new digital signal only if that new digital signal subsists for a predetermined time duration. This minimizes the number of write-in operations which are carried out and, consequently, possible deterioration of the memory device is avoided. As a numerical example, presettable counter 18 attains its predetermined count to produce the control signal on the order of about 4 seconds after it has been reset to its preset count by the trigger pulse generated by trigger pulse generator 4a. Hence, a digital signal which is changed in less than 4 seconds is not written into memory device 2. Accordingly, if the tuning condition of the tuner is varied by, for example, the operator in order to scan various broadcast frequencies, or to bring the tuner into a desired tuning condition, those intermediary digital signals which represent frequencies that are skipped over are not written into the memory device. Even if the tuning condition of the tuner remains momentarily (i.e., for less than 4 seconds) at a broadcast frequency, and then is changed, the digital signal representing this broadcast frequency is not stored.

It is appreciated that, when power to the tuner is interrupted, the digital signal then stored in address location [000] memory device 2 remains therein, and this digital signal represents the broadcast frequency to which the tuner had been tuned immediately prior to this power interruption. If the tuner had been tuned to a different broadcast frequency for less than 4 seconds immediately preceding the interruption in power, the digital signal representing this different broadcast frequency will not be stored in the memory device.

Figure 4:
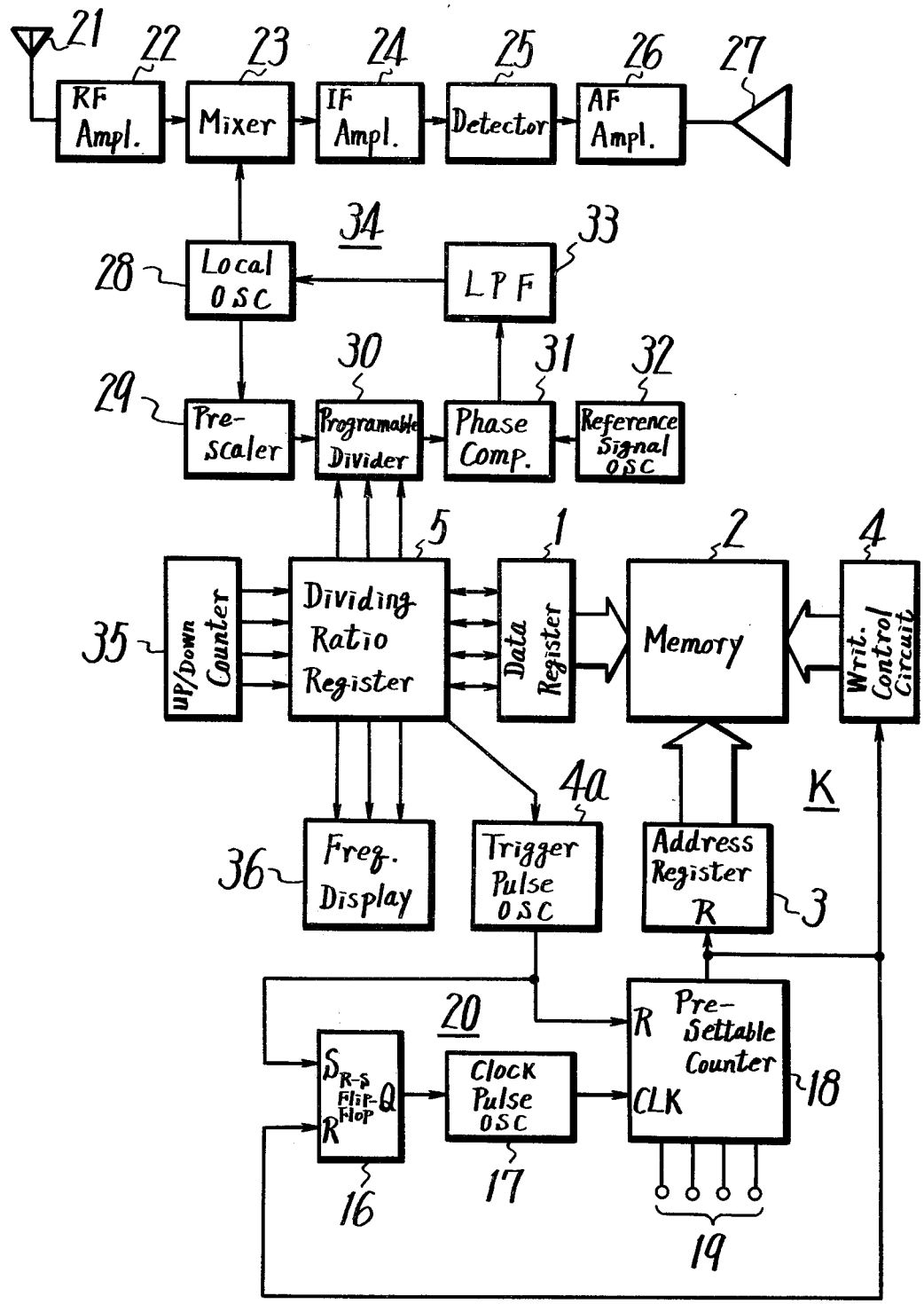
FIG. 4 is a block diagram showing the use of the present invention with a frequency synthesizer electronic tuner.

Referring now to FIG. 4, the use of the memory control circuit of this invention in conjunction with a frequency synthesizer tuner is illustrated. The frequency synthesizer tuner is comprised of an RF amplifier stage 22, a mixer 23, an IF demodulator 24, a detector 25, and an audio frequency amplifier 26. RF amplifier 22 is coupled to an antenna 21, or other input supply circuit, for supplying broadcast frequencies to the RF amplifier. The output of RF amplifier 22 is supplied to mixer 23 in which the RF signal is mixed with a local oscillating signal generated by a variable frequency local oscillator 28, to be described. The output of mixer 23 is constituted by a modulated IF signal which, after being amplified by IF amplifier 24, is detected by detector 25 to produce an audio frequency signal. This audio frequency signal is amplified by audio frequency amplifier 26 and reproduced as sound by, for example, a loudspeaker 27.

The local oscillating signal supplied to mixer 23 is generated by variable frequency local oscillator 28 which is included in a phase-locked loop 34. The phase-locked loop additionally includes a pre-scaler, or frequency divider 29, a programmable frequency divider 30, a reference oscillator 32 and a phase comparator 31. Variable frequency local oscillator 28, which may comprise a voltage-controlled oscillator (VCO) generates the local oscillating signal which is supplied to mixer 23 and, additionally, is supplied through pre-scaler 29 and programmable frequency divider 30 to phase comparator 31. The programmable frequency divider is adapted to divide the frequency of the local oscillating signal by a variable dividing ratio. As an example, the programmable frequency divider may comprise a presettable counter whose count is preset to a desired ratio. This desired ratio is established by the digital signal provided by dividing ratio register 5, described hereinabove.

The frequency-divided oscillating signal produced by programmable frequency divider 30 is determined by both the frequency of the local oscillating signal and the preset dividing ratio of the programmable frequency divider. This frequency-divided oscillating signal is supplied to one input of phase comparator 31. The other input of this phase comparator is supplied with a reference oscillating signal generated by reference oscillator 32. Preferably, the reference oscillator is a precise crystal oscillator for generating a reference signal of predetermined, precise frequency and phase. Any differential between the frequency-divided oscillating signal and the reference oscillating signal is detected by phase comparator 31 to produce an error signal. This error signal is fed back as a DC control voltage via low pass filter 33 to vary the frequency of the local oscillating signal generated by variable frequency local oscillator 28. As is conventional in a phase-locked loop, the frequency of the local oscillating signal is adjusted such that the frequency-divided oscillating signal and the reference oscillating signal are in frequency- and phase-coincidence. When this occurs, the local oscillating signal remains substantially fixed and thus determines the tuning condition of the frequency synthesizer tuner.

The dividing ratio to which programmable frequency divider 30 is preset is determined by the digital signal stored in dividing ratio register 5. This digital signal may be a count generated by an UP/DOWN counter 35 which is controlled by other circuitry (not shown) known to those of ordinary skill in the art, such as described in copending application Ser. No. 066,382, filed Aug. 14, 1979. When the count of UP/DOWN counter 35 is incremented or decremented, the digital signal in dividing ratio register 5 is correspondingly changed. This, in turn, varies the frequency dividing ratio of programmable frequency divider 30 so as to result in a change in the frequency of the local oscillating signal generated by variable frequency local oscillator 28. It is appreciated that this changes the tuning condition of the illustrated tuner. In addition, as the digital signal in dividing ratio register 5 changes, trigger pulse generator 4a is triggered to supply a trigger pulse to flip-flop circuit 16 and to presettable counter 18, as described above. When the count of UP/DOWN counter 35 remains substantially constant for a predetermined time duration (for example, on the order of about 4 seconds), then the digital signal provided by dividing ratio register 5 likewise remains substantially constant. This means that, as described hereinabove, presettable counter 18 is enabled to attain its predetermined count to supply the control signal to the reset input R of address register 3 and to the actuating input terminal of write-in control circuit 4. Consequently, the digital signal provided by dividing ratio register 5 and supplied via data register 1 to memory device 2 is stored in the predetermined [000] address location in this memory circuit. If the power supplied to the illustrated tuner now is interrupted, it is appreciated that the digital signal representing the broadcast frequency to which the tuner had been tuned immediately prior to this power interruption is stored in memory device 2 and, when power subsequently is resumed, this digital signal can be retrieved and supplied to dividing ratio register 5 to set the dividing ratio of programmable frequency divider 30 such that the tuner is tuned once again to this same broadcast frequency.

The digital signal in dividing ratio register 5 also is supplied to a frequency display 36 via a decoder (not shown), whereby the frequency which is represented by this digital signal is displayed. Thus, the user is provided with an indication of the particular frequency to which the tuner is tuned; this frequency being determined by the digital signal in dividing ratio register 5 which, in turn, sets the corresponding dividing ratio of programmable frequency divider 30.

Although not shown herein, memory device 2 also may be controlled by address register 3 to store other digital signals in suitable address locations, as selected by the address register. For example, a number of selector switches may be provided with the tuner, each selector switch being operable to control the address register to produce a corresponding address. When a selector switch is operated, the frequency-representing digital signal then supplied to data register 1 by dividing ratio register 5 is written into the address location then selected by the address register. Also, by operating the same selector switch, the digital signal stored in the associated address location in memory device 2 may be read out therefrom to dividing ratio register 5 so as to set the dividing ratio of programmable frequency divider 30, thereby establishing a corresponding tuning condition of the tuner. In this manner, those frequency-representing digital signals stored in the memory device may be retrieved therefrom, as desired, so as to tune the tuner to broadcast frequencies corresponding to those which have been retrieved.

While the present invention has been particularly shown and described with reference to a preferred embodiment thereof, and with reference to a preferred application thereof, it should be readily apparent to those of ordinary skill that various changes and modifications in form, details and application may be made. For example, sensing circuit 20 need not necessarily be comprised solely of clock pulse oscillator 17 and presettable counter 18. Rather, an equivalent timing circuit, such as a monstable multivibrator or the like, may be provided in order to initiate a timing interval during which a change in the digital signal provided by dividing ratio register 5 is detected. If no such change in the digital signal is sensed during this timing interval, then the digital signal may be written into the predetermined address location of memory device 2. Howwever, if a change in the digital signal is sensed during this timing interval, then a new timing interval is initiated and, therefore, the preceding digital signal is not written into the memory device. It is, therefore, intended that the appended claims be interpreted as including the foregoing as well as other such changes and modifications.

What is claimed is:

1. A memory control circuit for use with an addressable memory in an electronic radio frequency tuner of the type which includes a source of digital signals that are changeable with time, said digital signals representing radio frequencies to which said tuner is tunable, a write-in circuit for writing a digital signal into an addressed location of said memory, and a tuning circuit for establishing the tuning condition of said tuner as a function of a digital signal, said control circuit comprising addressing means for selecting address locations of said memory into which a digital signal is written; and means for sensing when a digital signal provided by said source remains constant for a predetermined time duration to energize said addressing means to select a predetermined address location of said memory and to actuate said write-in circuit to write said digital signal provided by said source into the predetermined location addressed by said addressing means.

2. The invention of claim 1 wherein said means for sensing comprises timing means responsive to each new digital signal provided by said source to initiate a timing interval and to produce a control signal to energize said addressing means and to actuate said write-in circuit at the conclusion of said timing interval, provided another timing interval is not initiated prior to the conclusion of a preceding timing interval.

3. The invention of claim 2 wherein said timing means comprises a source of clock pulses; counting means for counting said clock pulses to produce said control signal when a predetermined count has been attained; and means responsive to each new digital signal to preset said counting means to a preset count and to enable the counting of said clock pulses by said counting means.

4. The invention of claim 3 wherein said means to preset said counting means and to enable the counting of said clock pulses comprises trigger pulse generating means responsive to each new digital signal to generate a trigger pulse; and flip-flop means coupled to said trigger pulse generating means for being set to a first state in response to said trigger pulse, thereby enabling said clock pulses to be supplied to said counting means; and wherein said counting means includes an input terminal connected to receive each said trigger pulse so as to be set to said preset count.

5. The invention of claim 4 further comprising means for supplying said control signal to said flip-flop means to reset the latter to a second state and thereby inhibit said clock pulses from being supplied to said counting means.

6. The invention of claim 5 wherein said counting means includes preset input terminals supplied with a predetermined preset count signal such that said counting means is set to the preset count determined by said preset count signal in response to each trigger pulse received at said input terminal thereof.

7. The invention of claim 1 wherein said addressable memory is a non-volatile memory device.

8. The invention of claim 1 wherein said source of digital signals comprises a date register.

9. The invention of claim 8 wherein said tuner is a frequency synthesizer tuner having a phase-locked loop comprising a variable frequency oscillator for producing a local oscillating signal, a programmable frequency divider coupled to said variable frequency oscillator to divide the frequency of said local oscillating signal by a dividing ratio determined by said digital signals in said data register, a reference oscillator for producing a reference oscillating signal, a phase comparator for comparing the frequency-divided local oscillating signal to said reference oscillating signal to produce an error signal, and feedback means for feeding back the error signed to said variable frequency oscillator to adjust the frequency of the local oscillating signal.

10. A memory control circuit for controlling a write-in operation of an addressable memory circuit whereby a digital signal that is changeable over time is written into an addressed location in said memory circuit, comprising addressing means for selecting the addressed location in said memory circuit into which a digital signal is to be written; and control signal generating means for sensing when a digital signal to be written into said memory circuit remains unchanged for a predetermined time interval so as to generate a control signal, said control signal being supplied to said addressing means for selecting said addressed location, and said control signal being supplied to said memory circuit to initiate a write-in operation.

11. The invention of claim 10 wherein said control signal generating means comprises trigger pulse generating means responsive to each change in said digital signal to generate a trigger pulse; flip-flop means coupled to said trigger pulse generating means for being set to a first state in response to a trigger pulse; clock pulse generating means for generating clock pulses; counting means coupled to said trigger pulse generating means for being set to a preset count in response to a trigger pulse and for counting said clock pulses until a predetermined count is reached to produce said control signal, said clock pulses being supplied from said clock pulse generating means to said counting means when said flip-flop means is in the first state thereof; and means for resetting said flip-flop means to a second state in response to said control signal, thereby to inhibit further clock pulses from being supplied to said counting means.

12. The invention of claim 11 wherein said addressing means comprises an address register responsive to each control signal to select a predetermined addressed location in said memory circuit.

13. The invention of claim 12 wherein said address register includes a reset input supplied with said control signal to be reset to a predetermined condition, thereby to select said predetermined addressed location.

* * * * *